United States Patent [19]

Shaw et al.

[11] Patent Number: 5,296,893

[45] Date of Patent: Mar. 22, 1994

[54] BOX FOR AN OPTICAL STEPPER RETICLE

[75] Inventors: Charles G. Shaw, San Antonio; Edward R. Vokoun, III, Boerne, both of Tex.

[73] Assignee: VLSI Technology, Inc., San Jose, Calif.

[21] Appl. No.: 923,728

[22] Filed: Jul. 31, 1992

[51] Int. Cl.$^5$ ............................................. G03B 27/62
[52] U.S. Cl. ........................................ 355/75; 355/125
[58] Field of Search ............................. 355/75, 125, 53

[56] References Cited

U.S. PATENT DOCUMENTS

4,924,258  5/1990  Tsutsui ................................. 355/53

Primary Examiner—Richard A. Wintercorn
Attorney, Agent, or Firm—Hickman & Beyer

[57] ABSTRACT

A reticle box characterized by a generally rectangular base member having a base portion and four contiguous wall portions, a generally rectangular cover member which can be engaged with the base member to fully enclose a reticle, and a closing mechanism which causes resilient stand-offs attached to the base member and the cover member to firmly grip the reticle within the box. Mating peripheral seals are provided around portions of the base member and the cover member to prevent the influx of contaminants. The cover member is of unitary design with an integral frame portion, central cover portion, and hinge. The reticle box is preferably made from a non-static plastic material.

18 Claims, 8 Drawing Sheets

BOX FOR AN OPTICAL STEPPER RETICLE

BACKGROUND OF THE INVENTION

This invention relates generally to the manufacture of integrated circuits, and more particularly to reticle boxes which hold the reticles used in optical stepper machines to project an image of an integrated circuit layer onto a semiconductor wafer.

Photolithography is a necessary process in the production of most integrated circuits. The photolithography process includes the steps of forming a resist layer over semiconductor wafer, exposing the resist layer to a patterned light source, developing the resist layer, processing the semiconductor wafer through the developed resist layer, and removing the resist layer.

An optical stepper apparatus is often used to expose the resist layer. An image of a layer of an integrated circuit die is formed on a small, square piece of glass called a reticle. The reticle is placed in the optical stepper apparatus and the image of the layer is reduced and projected onto a portion of a resist layer covering the semiconductor wafer. The reticle is then indexed and the reduced image is focused on another portion of the resist layer and so forth until a majority of the resist layer has been exposed. A typical reticle is about 5-7 inches square, and the image of the layer is typically reduced to about 300-500 millimeters square.

Reticles are often stored in reticle boxes. Some optical stepper apparatus include a stepper reticle loader mechanism which automatically opens a reticle box, inserts the reticle into the stepper apparatus, exposes the wafer, returns the reticle to the stepper box, and closes the box. This type of automated handling is preferable because it minimizes contamination of and damage to the reticle and the stepper apparatus.

Figure 1:
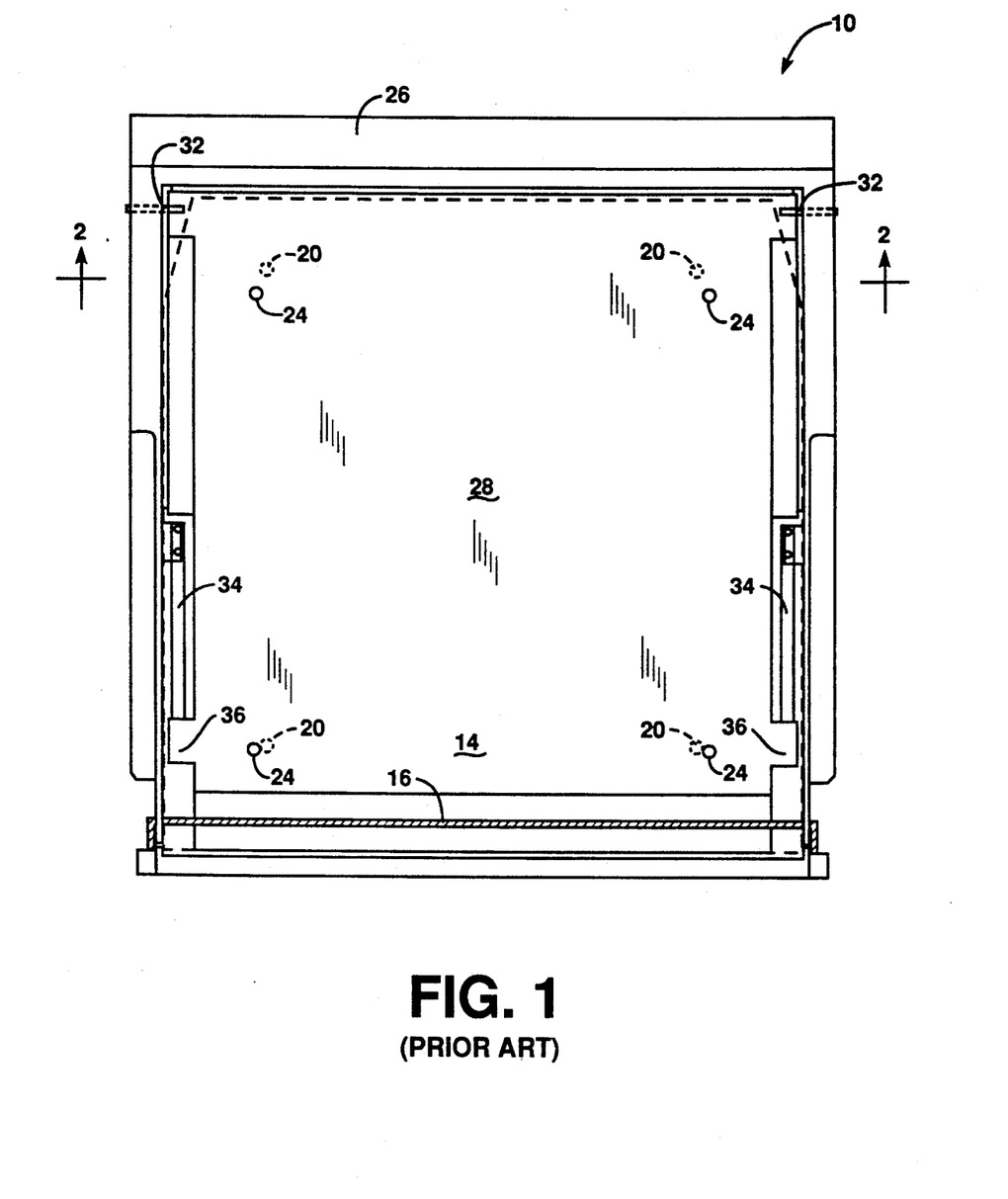
FIG. 1 is a top plan view of a prior art reticle box.
Figure 2:
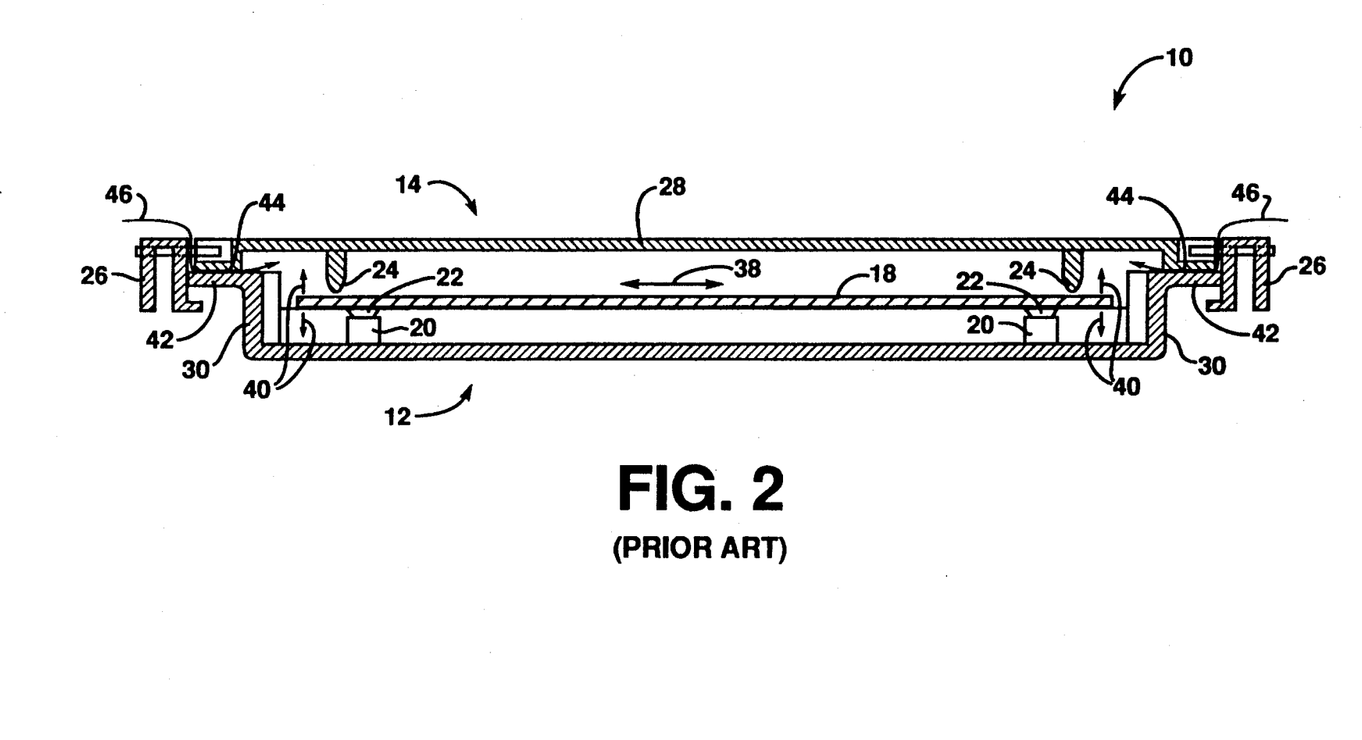
FIG. 2 is a cross-sectional view taken along line 2—2 of FIG. 1.

FIGS. 1 and 2 illustrate a reticle box which is commercially available from Canon, Inc. of Tokyo, Japan. FIG. 1 is a top plan view of a closed reticle box 10, and FIG. 2 is a cross-sectional view of the box taken along line 2—2 of FIG. 1. With reference to both figures, the reticle box 10 includes a base member 12 and a cover member 14 which is slidingly engageable with the base member 12. A camming bar 16 locks the cover member 14 to the base member 12. When closed and locked, the reticle box 10 surrounds a reticle 18 disposed within the box. The reticle is supported on its bottom surface by four base stand-offs 20 which include a resilient portion 22. Four cover stand-offs 24 extend close to, but do not touch, a top surface of the reticle 18.

In FIG. 1, it can be seen that the cover member 14 is an assembly of several parts including a frame portion 26 and a central cover portion 28. It is the frame portion 26 of the cover member 14 which engages with walls 30 of the base member 12. A pair of metal hinge pins 32 connect the frame portion 26 to the central cover portion 28. The hinge pins permit the opposing end of the central cover portion 28 (i.e. the end near camming bar 16) to pivot slightly upwardly and downwardly. A pair of metal leaf-springs 34 are attached to frame portion 26 and bias the pivoting end of the central cover portion away from the base member 12.

When the base member 12 and cover member 14 are fully engaged, the camming bar 16 may be rotated to force down the pivoting end of the central cover portion 28. This causes a pair of tabs 36 to engage with slots (not seen) on the upper portion of base member 12 to lock the cover member 14 to the base member 12. Even in this locked position, the reticle 18 is free to move slightly from side-to-side (as indicated by arrow 38 in FIG. 2), or up-and-down (as indicated by arrows 40 in FIG. 2).

Reticle box 10 has several drawbacks. For one, it is made from a plastic material which can accumulate a considerable amount of static charge—sometimes in excess of 1000 volts d.c. This high static charge can disrupt or damage delicate circuitry, mechanisms and optics of an optical stepper apparatus.

Another serious problem is the possibility of damage to a reticle 18 due to the loose way it is held within the reticle box 10. As the reticle moves back-and-forth and up-and-down, it can become scratched or broken. Since the reticle 18 sits loosely on the base stand-offs 20, the reticle box 10 must be stored in a flat, upright position. This means that a number of reticle boxes 10 cannot be compactly stored on their sides, nor can the reticle box 10 be used for shipping reticles.

Another problem with reticle box 10 is the use of metal hinge pins 32 and leaf springs 34. These metal surfaces rub against plastic surfaces of the cover member 14, creating a shower of particles which can contaminate the reticle box 10 and/or the reticle 18. With today's microscopic feature widths in I.C. devices, even small amounts of contaminants can damage an IC during the production process.

The reticle box 10 also has problems with contamination from yet another source. The walls 30 of base member 12 have peripheral flanges 42 which press against peripheral flanges 44 of cover member 14. Even when camming bar 16 is in a locked position, openings around the perimeter of the reticle box 10 allows a free path for particle entry into the box past these flanges as indicated by arrows 46.

Another drawback of reticle box 10 is that it has many parts and is therefore relatively difficult and expensive to manufacture. For example, the cover member 14 is a multi-part unit including a number of pins, leaf-springs, screws, etc. It would, of course, be desirable to reduce the number of parts of the reticle box to reduce its cost and to increase its reliability.

SUMMARY OF THE INVENTION

A reticle box in accordance with the present invention holds a reticle securely for shipment and for storage in any orientation. It further reduces self-contamination and contamination of reticles by minimizing metal/plastic friction points and by sealing the interior of the box from the ambient environment. The reticle box of the present invention is of simplified construction, lowering production costs, and is resistant to static build-up, which might damage sensitive IC production equipment.

Briefly, the invention includes a base member adapted to contact a first side of a reticle, a cover member adapted to engage the base member so that they cooperatively fully enclose the reticle, and a closing mechanism which urges a portion of the cover member into firm contact with a second side of the reticle to inhibit the reticle from moving. With the reticle held in this manner, the reticle box can be stored on its side, on its end, or in any other orientation. The reticle box of the present invention can further be used as a shipping container for stepper reticles.

The base member and the cover member are preferably provided with complementary perimeter seals which prevent the influx of particulates into the box when the closing mechanism is activated. The closing mechanism also preferably locks the base member and the cover member together to prevent the box from accidentally opening.

The cover member is preferably of unitary construction including a frame portion, a central cover portion, and a hinge mechanism which connects the central cover portion to the frame portion. The hinge mechanism permits a front section of the central cover portion to pivot slightly up and down.

The reticle box of the present invention is preferably made from an antistatic plastic material. Except for the camming bar of the closing mechanism, all metal parts have been eliminated to simplify the construction of the box and to eliminate sources of contamination. The elimination of parts and the unitary construction of the cover member greatly reduces the cost and complexity in manufacturing the reticle box of the present invention.

These and other advantages of the present invention will become apparent to those skilled in the art upon a reading of the following descriptions and a study of the several figures of the drawing.

BRIEF DESCRIPTION OF THE DRAWINGS

FIG. 4a is an enlarged view of the portion of FIG. 4 encircled by broken line 4a;

FIG. 5b is a cross-sectional view taken along line 5b—5b of FIG. 5a;

FIG. 6b is a cross-sectional view taken along line 6b—6b of FIG. 6a;

DETAILED DESCRIPTION OF THE PREFERRED EMBODIMENTS

Figure 3:
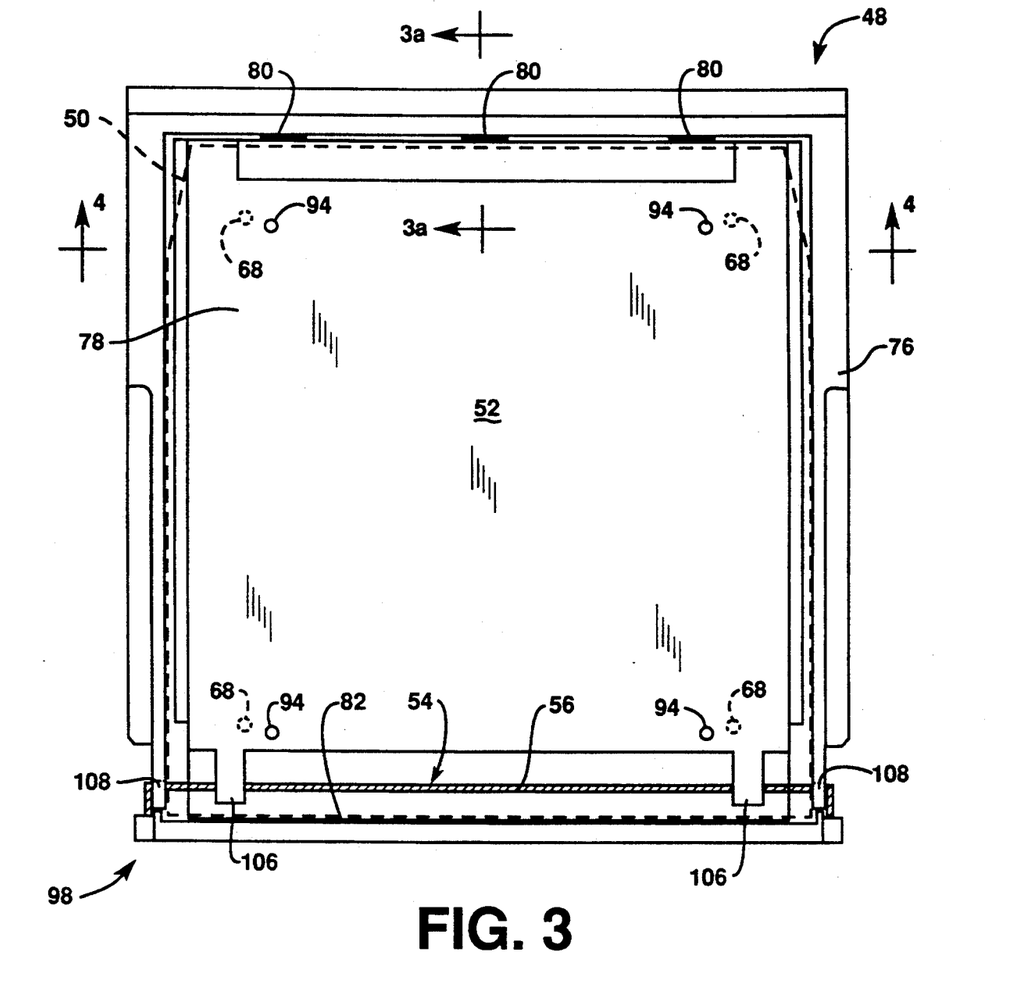
FIG. 3 is a top plan view of a reticle box in accordance with the present invention.
Figure 4:
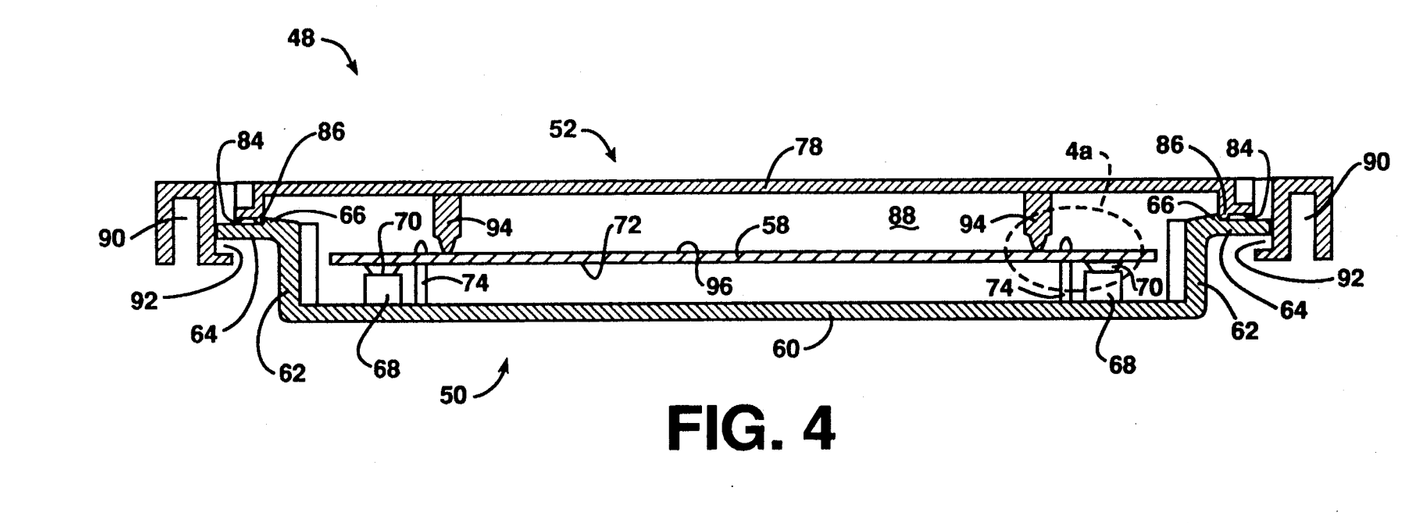
FIG. 4 is a cross-sectional view taken along line 4—4 of FIG. 3.

FIGS. 1 and 2 illustrate a reticle box of the prior art. In FIGS. 3 and 4, a reticle box 48 in accordance with the present invention includes a base member 50, a cover member 52, and a locking mechanism 54 including a camming bar 56. A reticle 58 is shown held within the reticle box 48 in FIG. 4.

Figure 3A:
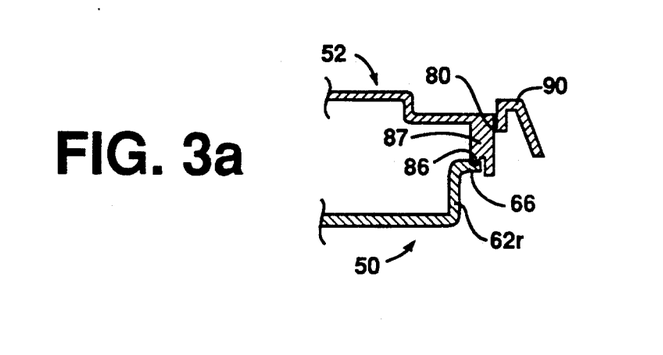
FIG. 3a is a cross-sectional view taken along line 3a—3a of FIG. 3.
Figure 7:
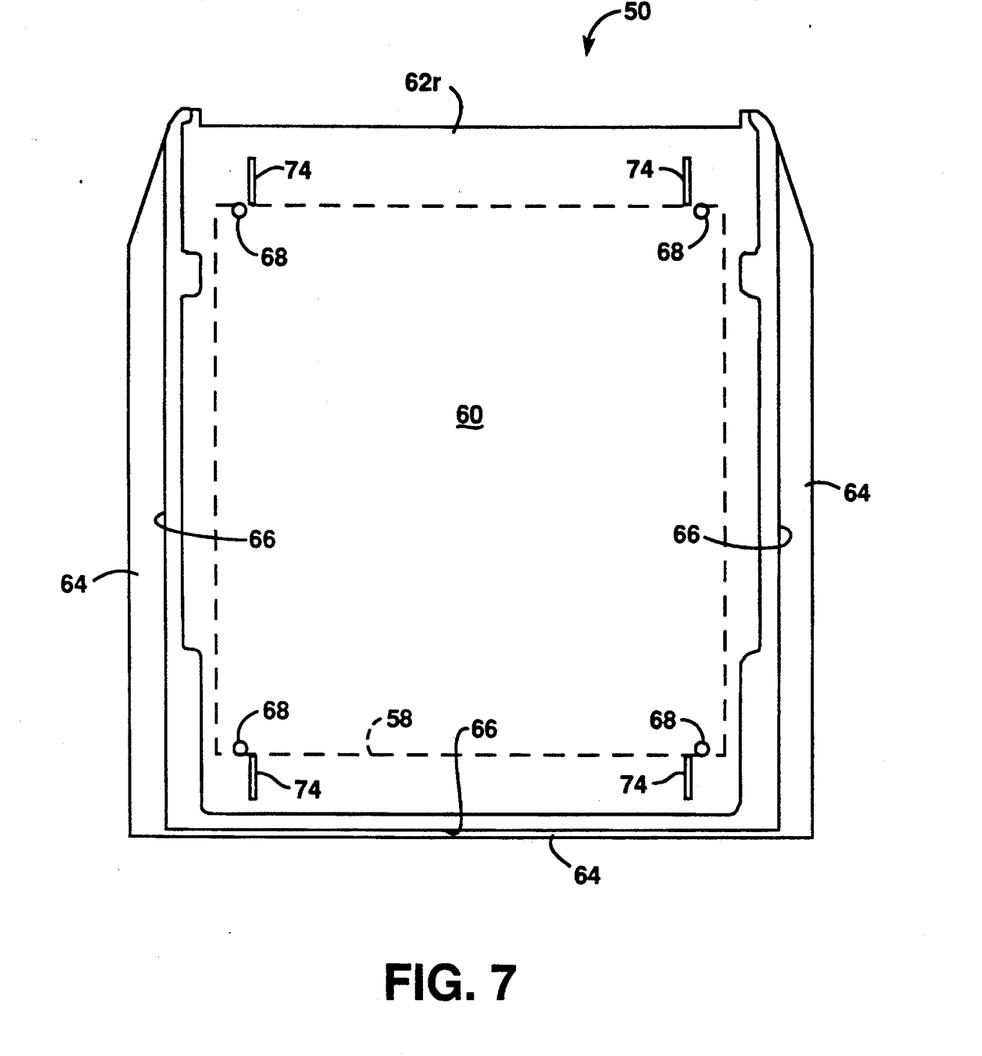
FIG. 7 is a top plan view of the base member of the reticle box with the cover member removed.

With reference to FIGS. 4 and 7, the base member 50 is of substantially unitary construction and includes a base portion 60 and four, contiguous wall portions 62 extending upwardly from the base portion 60. The base portion 60 is substantially rectangular in configuration. The tops of the wall portions 62 are provided with flanged portions 64 provided with a base perimeter seal 66. As seen in FIG. 3a, an upper portion of the rear wall portion 62r is also provided with base perimeter seal 66. In total, the base perimeter seal 66 fully surrounds the perimeter of base portion 60.

The base member 50 is provided with four base stand-offs 68. The base stand-offs 68 include a resilient tip 70 which engages a lower surface 72 of the reticle 58. The resilient tip 70 can be made from a soft, springy, plastic material, such as silicone or the like. The base member 50 is also provided with four stops 74 extending upwardly from the base portion 60 for engaging opposing ends of the reticle 58.

The cover member 52 is best seen in FIGS. 3 and 4. The cover member is of substantially unitary design and includes an integral frame portion 76, central cover portion 78, and hinge mechanism 80. The cover member 52 is substantially rectangular in configuration. As will be discussed in greater detail subsequently, the frame portion 76, central cover portion 78, and hinge mechanism 80 are all preferably formed from a low particulate, anti-static plastic material. The plastic hinge mechanism 80 allows the end 82 of central cover portion 78 to pivot slightly towards and away from the base portion 60.

The frame portion 76 is provided with a flange surface 84 having a cover perimeter seal 86 which can engage the base perimeter seal 66. The cover perimeter seal 86 is also provided near the hinges 80 on a flange 87 (see FIG. 3a) and near end 82 to seal with corresponding base perimeter seals of the base member 50 (see FIGS. 5b and 6b). When the cover member 52 is fully engaged with the base member 50, the interior volume 88 of the box 48 is fully sealed along all four sides to prevent the influx of particles from the ambient environment.

The frame portion 76 also includes a pair of downwardly facing channel portions 90. The frame portion 76 provides a pair of tracks 92 which engage the side flanges 64 of the base member 50 such that the cover member 52 is slidingly engaged with the base member 50.

Figure 4A:
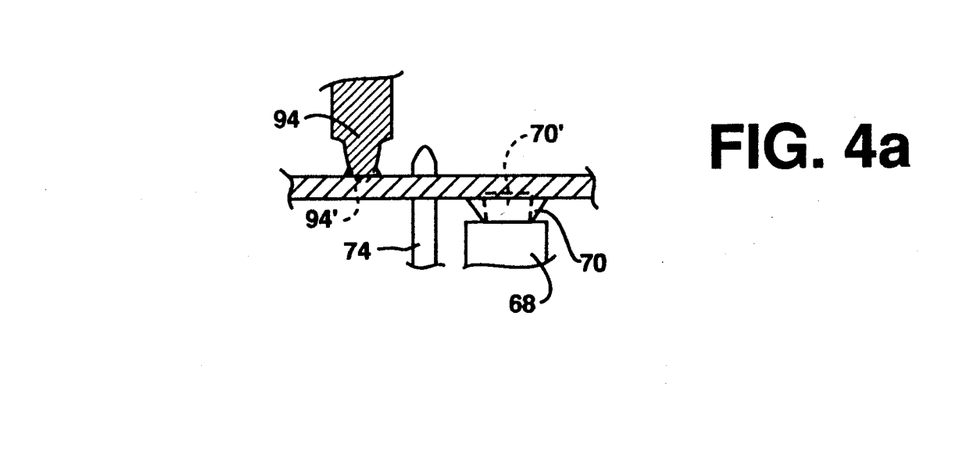

The cover member 52 is further provided with four resilient cover standoffs 94 which operationally are firmly pressed against the upper surface 96 of the reticle 58. More specifically, when the locking mechanism 54 is activated, the central cover portion 78 is urged towards the base member 50 and the resilient cover stand-offs 94 are pressed into the upper surface 96 with sufficient force to slightly deform both the cover stand-offs 94 and the resilient portions 70 of base stand-offs 68. This is best seen in FIG. 4a where the stand-off 94 and resilient portion 70 of stand-off 68 are deformed from their undeformed shapes as indicated at 94' and 70', respectively. The gripping force between the cover stand-offs 94 and the base stand-offs 68 is sufficient to firmly grip the reticle 58 and to prevent it from moving under all but the most adverse of conditions.

The base member 50 and cover member 52 are preferably made from a low particulate, anti-static plastic such as Baylon in an injection molding process. Such anti-static plastics are typically somewhat conductive. The base member 50 is preferably pigmented so that it is opaque (permitting the viewing of particulates on its surfaces), and the cover member 52 is preferably unpigmented so that it is transparent to permit the viewing of the reticle 58 stored within the reticle box 48. Of course, both the base member 50 and the cover member 52 can be clear, opaque, or some combination of the two.

Figure 5A:
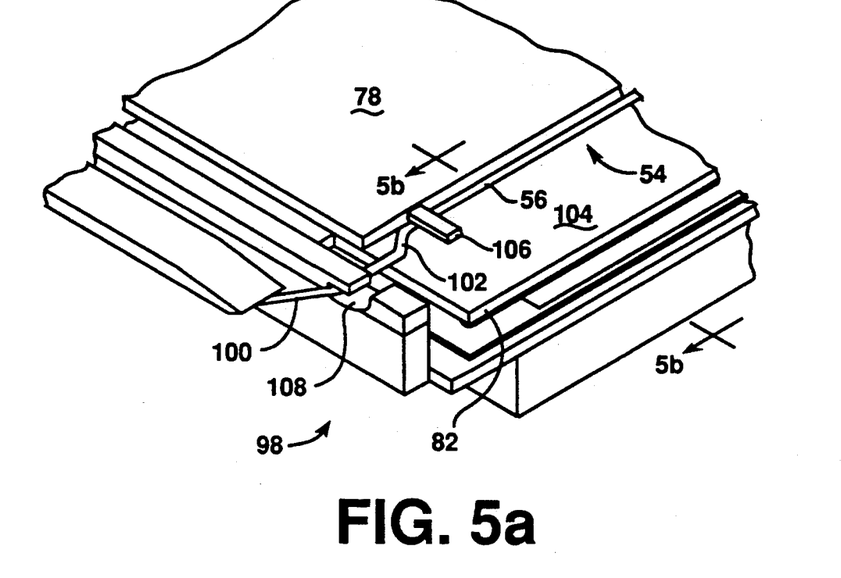
FIG. 5a is a perspective view of a corner 98 of the reticle box of FIG. 3 with the camming bar 56 in an open position.

FIG. 5a is a perspective view of the front-left corner 98 of the reticle box 48. In this view, the camming bar 56 has its handle 100 rotated such that the locking mechanism 54 is in its open position. More specifically, the locking mechanism 54 includes the camming bar 56 having a camming bend 102 which engages a camming surface 104 at the end of the central cover portion 78. The camming bar 56 is held against the camming surface 104 by a pair of tabs 106. End portions of the camming bar 56 are engaged with slots 108 of the frame portion 76.

Figure 5B:
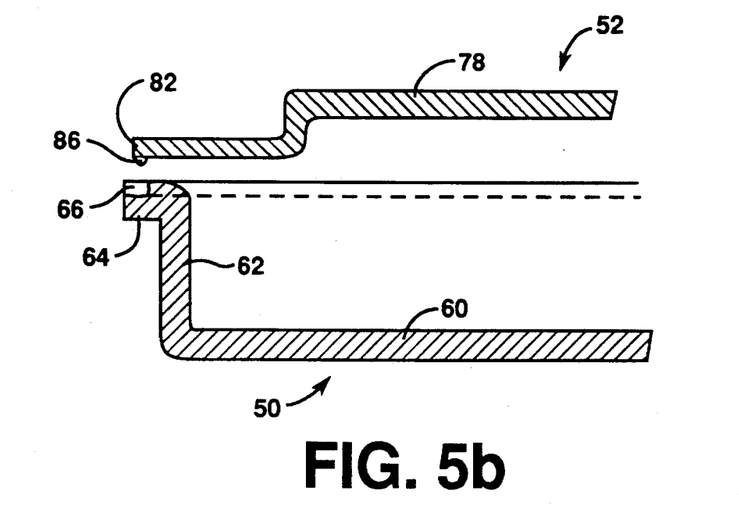

With additional reference to FIG. 5b, when the camming bar handle 100 is in the position shown in FIG. 5a, a the end 82 is lifted away from the flange 64 of the base member 50. This disengages the portion of the cover perimeter seal 86 from the base perimeter seal 66, thereby unlocking the cover member 52 from the base member 50. When in this position, the cover member 52 may freely slide from the base member 50 for removal.

Figure 6A:
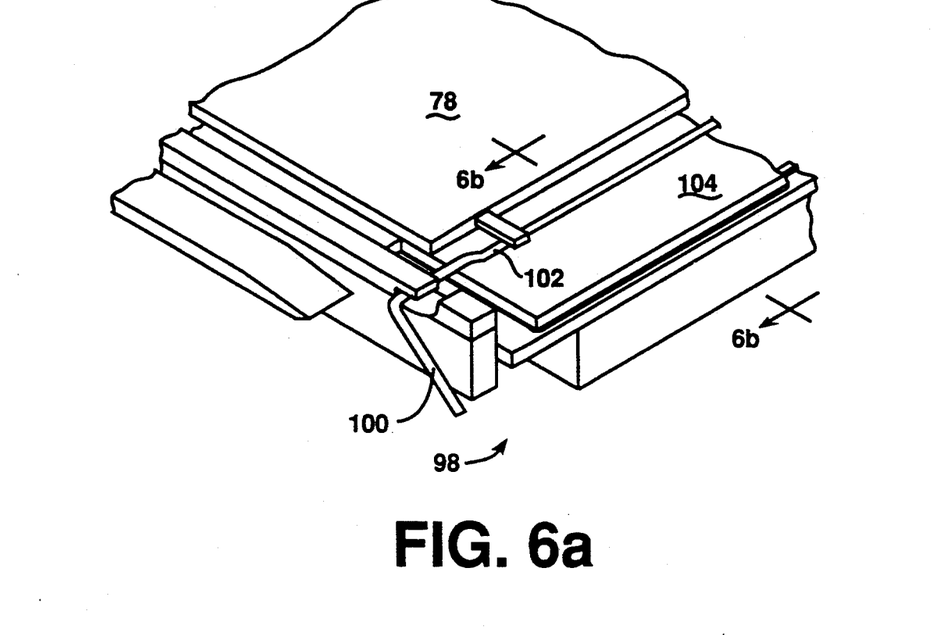
FIG. 6a is a perspective view of the corner 98 of the reticle box of FIG. 3 with the camming bar 56 in a closed position.
Figure 6B:
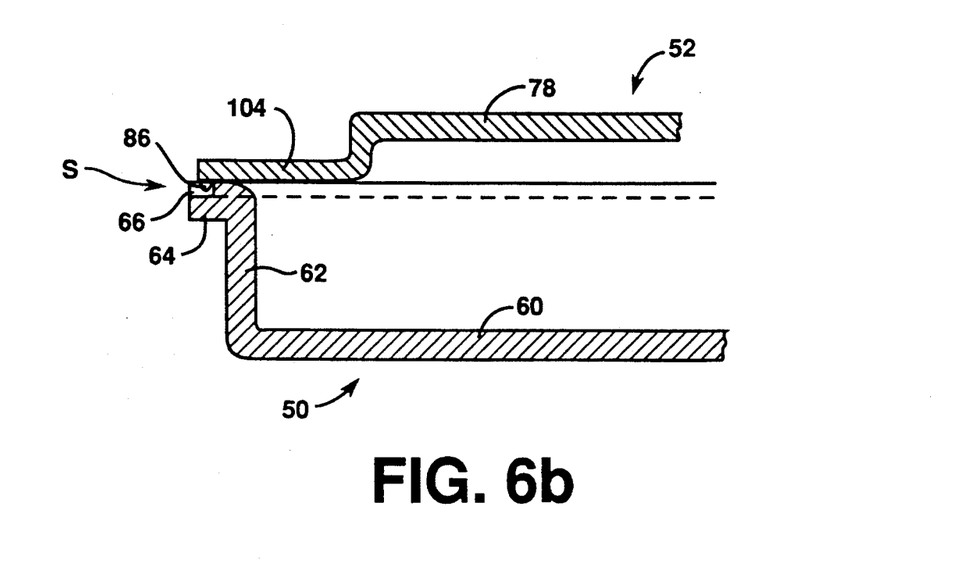

With reference to FIGS. 6a and 6b, when the camming bar handle 100 is rotated to the forward position, the bend 102 of the camming bar 56 pushes down on the camming surface 104 and firmly engages the cover perimeter seal 86 with the base perimeter seal 66. When in this position, the cover member 52 cannot slide off of the base member 50 because of the interlocking seals at position S, and the reticle box 48 is firmly locked.

The rotation of the camming bar handle 100 to the position shown in FIG. 6a accomplishes more than just locking the reticle box. It also provides the force for urging the cover stand-offs 94 against the reticle 58 and for providing a good sealing force around the box for engaging the base perimeter seal 66 and the cover perimeter seal 86.

Figure 8:
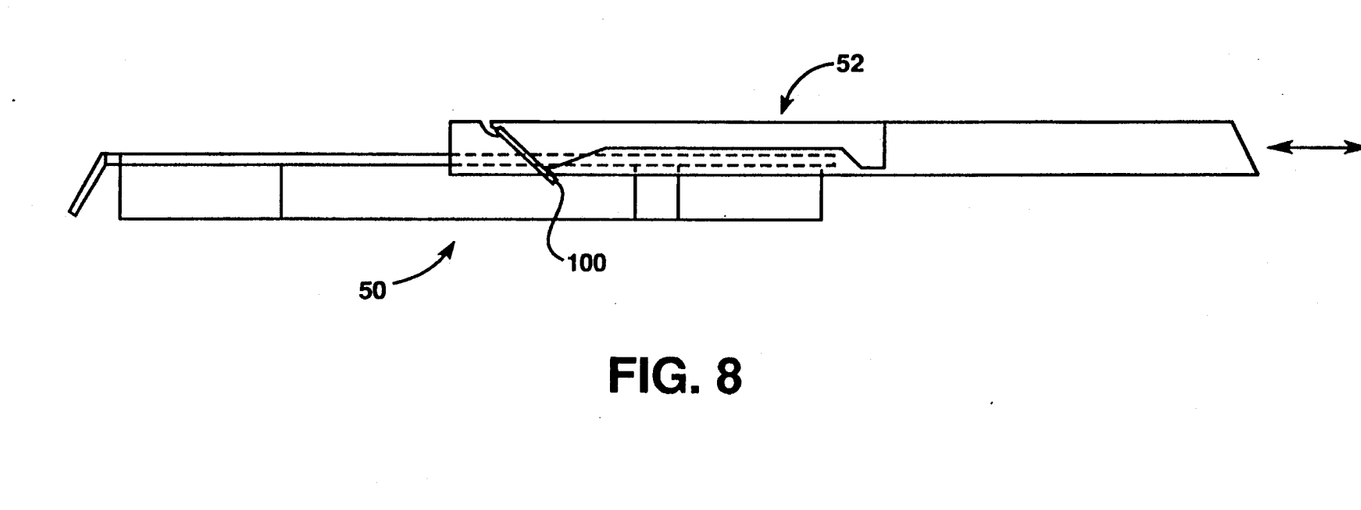
FIG. 8 is a side elevational view of the reticle box illustrating the sliding engagement of the base member and the cover member.

In FIG. 8, the camming bar handle 100 is shown in the open position illustrated in FIG. 5a. When in this position, the cover stand-offs are lifted from or very lightly touching the reticle 58, and the front seal S is disengaged. A small amount of force will slide cover member 52 on or off of the base member 50.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. A reticle box comprising:
   base means having stand-off means adapted to contact a first side of a reticle, said base means defining a perimeter and being substantially solid within said perimeter;
   cover means adapted to operationally engage said base means such that said base means and said cover means substantially fully enclose said reticle; and
   closing means operative to urge a portion of said cover means into firm contact with a second side of said reticle, whereby said reticle is inhibited from moving.

2. A reticle box as recited in claim 1 wherein said base means is provided with a base perimeter seal proximate to said perimeter of said base and said cover means is provided with a complementary cover perimeter seal, and wherein said closing means is operative to engage said base perimeter seal with said cover perimeter seal.

3. A reticle box as recited in claim 2 wherein the engagement of said base perimeter seal with said cover perimeter seal locks said cover means to said base means.

4. A reticle box as recited in claim 1 further comprising base locking means provided as part of said base means and cover locking means provided as part of said cover means, wherein said closing means is operative to engage said base locking means with said cover locking means to lock said cover means to said base means.

5. A reticle box as recited in claim 1 wherein said cover means comprises a frame portion which is slidingly engageable with said base means, a central cover portion, and hinge means coupling said central cover portion to said frame means.

6. A reticle box comprising:
   base means adapted to contact a first side of a reticle;
   cover means adapted to operationally engage said base means such that said base means and said cover means substantially fully enclose said reticle, wherein said cover means comprises a frame portion which is slidingly engageable with said base means, a central cover portion, and hinge means coupling said central cover portion to said frame means, and wherein said frame portion, said central cover portion, and said hinge means are formed as an integral unit; and
   closing means operative to urge a portion of said cover means into firm contact with a second side of said reticle, whereby said reticle is inhibited from moving.

7. A reticle box as recited in claim 6 wherein said cover means is made, at least in part, from an anti-static plastic material, and wherein said hinge means comprises at least one plastic hinge which permits said central cover portion to pivot forward and away from said base means.

8. A reticle box comprising:
   base means adapted to contact a first side of a reticle;
   cover means adapted to operationally engage said base means such that said base means and said cover means substantially fully enclose said reticle, wherein said cover means comprises a frame portion which is slidingly engageable with said base means, a central cover portion, and hinge means coupling said central cover portion to said frame means; and
   closing means operative to urge a portion of said cover means into firm contact with a second side of said reticle, whereby said reticle is inhibited from moving;
   wherein said portion of said cover means which is urged into firm contact with a second side of said reticle comprises at least one resilient cover stand-off coupled to said central cover portion, wherein said cover stand-off flexes against said second side of said reticle when said closing means is activated.

9. A reticle box as recited in claim 8 further comprising at least one resilient base stand-off coupled to said base means, wherein said base stand-off flexes against said first side of said reticle when said closing means is activated such that said reticle is gripped between said base stand-off and said cover stand-off.

10. A reticle box as recited in claim 9 wherein there are at least three resilient cover stand-offs coupled to said central cover portion and at least three resilient base stand-offs coupled to said base means, whereby when said closing means is activated said reticle is gripped between said at least three base stand-offs and said at least three cover stand-offs.

11. A reticle box as recited in claim 8 wherein said base means is made, at least in part, with an anti-static plastic material.

12. A reticle box comprising:
a generally rectangular base means having a base portion and four contiguous wall portions extending from said base portion, said base means being provided with a plurality of resilient base stand-offs extending from said base portion and adapted to engage a first surface of a reticle, where portions of said base means comprise a base perimeter seal;
a generally rectangular cover means adapted to operationally engage said base means such that said base means and said cover means fully enclose said reticle, said cover means including a frame portion which is slidingly engageable with said base means, a central cover portion, and hinge means coupling said central cover portion to said frame means, where portions of said cover means comprise a cover perimeter seal, and a plurality of resilient cover stand-offs extending from said central cover portion; and
closing means operative to urge said central cover portion towards said reticle such that said reticle is gripped between said plurality of base stand-offs and said plurality of cover stand-offs, and such that said base perimeter seal engages said cover perimeter seal.

13. A reticle box as recited in claim 12 wherein said engagement of said base perimeter seal and said cover perimeter seal locks said cover means to said base means.

14. A reticle box as recited in claim 13 wherein said base means and said cover means are both primarily made of an anti-static plastic material.

15. A reticle box as recited in claim 14 wherein said frame portion, said central cover portion, and said hinge means are formed as an integral unit.

16. A reticle box as recited in claim 15 wherein there are at least three base stand-offs extending from said base portion and there are at least three cover stand-offs extending from said central cover portion.

17. A reticle box as recited in claim 16 wherein there are four base stand-offs and four cover stand-offs.

18. A reticle box as recited in claim 17 wherein said four base stand-offs are not aligned with said four cover stand-offs.

* * * * *